(12) United States Patent
Kong et al.

(10) Patent No.: US 8,499,215 B2
(45) Date of Patent: Jul. 30, 2013

(54) MULTI-LEVEL CELL MEMORY DEVICES AND METHODS OF STORING DATA IN AND READING DATA FROM THE MEMORY DEVICES

(75) Inventors: Jun Jin Kong, Yongin-si (KR); Sung Chung Park, Daejeon (KR); Dong Ku Kang, Seongnam-si (KR); Young Hwan Lee, Suwon-si (KR); Si Hoon Hong, Seongnam-si (KR); Jae Woong Hyun, Uijeongbu-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1367 days.

(21) Appl. No.: 11/802,656

(22) Filed: May 24, 2007

(65) Prior Publication Data

US 2008/0151621 A1  Jun. 26, 2008

(30) Foreign Application Priority Data

Dec. 26, 2006  (KR) .................. 10-2006-0134049

(51) Int. Cl.
*H03M 13/29* (2006.01)
*G11C 29/00* (2006.01)
(52) U.S. Cl.
USPC ..................... 714/755; 714/773; 714/778
(58) Field of Classification Search
USPC ............................... 714/755, 773, 778
See application file for complete search history.

(56) References Cited

U.S. PATENT DOCUMENTS

| 6,212,654 B1 | 4/2001 | Lou et al. |
| 6,279,133 B1 | 8/2001 | Vafai et al. |
| 6,483,742 B1 | 11/2002 | Sweha et al. |
| 6,757,193 B2 | 6/2004 | Chen et al. |
| 6,870,774 B2 | 3/2005 | Roohparvar et al. |
| 7,047,478 B2 | 5/2006 | Gregori et al. |

(Continued)

FOREIGN PATENT DOCUMENTS

| JP | 10-222989 | 8/1998 |
| JP | 11-143787 | 5/1999 |
| KR | 10-2001-0005558 | 1/2001 |
| KR | 10-2003-0014365 | 2/2003 |

OTHER PUBLICATIONS

International Search Report dated Oct. 11, 2007, for International Application No. PCT/KR2007/003260.

(Continued)

*Primary Examiner* — Stephen M Baker
(74) *Attorney, Agent, or Firm* — Harness, Dickey & Pierce, P.L.C.

(57) ABSTRACT

A multi-level cell (MLC) memory device may include 'a' number of m-bit MLC memory cells; an encoder that encodes 'k' bits of data at a code rate of k/n to generate an encoded bit stream; and a signal mapping module that applies pulses to the MLC memory cells in order to write the encoded bit stream in the MLC memory cells. In the device, 'a' and 'm' may be integers greater than or equal to 2, 'k' and 'n' may be integers greater than or equal to 1, and 'n' may be greater than 'k'. A method of storing data in the device may include encoding 'k' bits of data at a code rate of k/n to generate an encoded bit stream. A method of reading data from the device may include decoding 'n' bits of data at a code rate of n/k to generate a decoded bit stream.

11 Claims, 6 Drawing Sheets

U.S. PATENT DOCUMENTS

| | | |
|---|---|---|
| 7,082,056 B2 | 7/2006 | Chen et al. |
| 7,231,585 B2 * | 6/2007 | Vainsencher et al. ......... 714/784 |
| 7,330,370 B2 * | 2/2008 | Rinerson et al. .............. 365/158 |
| 7,533,328 B2 * | 5/2009 | Alrod et al. ................... 714/786 |
| 7,558,109 B2 * | 7/2009 | Brandman et al. ....... 365/185.03 |
| 7,805,663 B2 * | 9/2010 | Brandman et al. ............ 714/794 |
| 7,844,879 B2 * | 11/2010 | Ramamoorthy et al. ..... 714/763 |
| 2007/0171714 A1 * | 7/2007 | Wu et al. .................. 365/185.09 |

OTHER PUBLICATIONS

Office Action for corresponding Japanese patent application No. 2009-543914 dated Apr. 17, 2012.

* cited by examiner

MULTI-LEVEL CELL MEMORY DEVICES AND METHODS OF STORING DATA IN AND READING DATA FROM THE MEMORY DEVICES

PRIORITY STATEMENT

This application claims priority from Korean Patent Application No. 10-2006-0134049, filed on Dec. 26, 2006, in the Korean Intellectual Property Office (KIPO), the entire contents of which are incorporated herein by reference.

BACKGROUND

1. Field

Example embodiments relate to semiconductor memory devices, methods of storing data in the memory devices, and methods of reading data from the memory devices. Also, example embodiments relate to multi-level cell (MLC) memory devices, methods of storing data in the MLC memory devices, and methods of reading data from the MLC memory devices.

2. Description of Related Art

A single-level cell (SLC) memory device stores one bit of data in a single memory cell. The SLC memory device also is referred to as a single-bit cell (SBC) memory.

FIG. 1 illustrates a cell threshold voltage distribution of a SLC memory device according to related art. As shown in FIG. 1, the SLC memory stores and reads data of one bit at a voltage level included in two distributions divided by a threshold voltage level programmed in a memory cell. For example, when a voltage level read from the memory cell is greater than 0.5 V and less than 1.5 V, it is determined that the data stored in the memory cell has a logic value of "1". When the voltage level read from the memory cell is greater than 2.5 V and less than 3.5 V, it is determined that the data stored in the memory cell has a logic value of "0". The data stored in the memory cell is classified depending on the difference(s) between cell currents and/or cell voltages during the reading operations.

Meanwhile, a MLC memory device that can store data of two or more bits in a single memory cell has been proposed in response to a need for higher integration of memory. The MLC memory device also is referred to as a multi-bit cell (MBC) memory. However, as the number of bits stored in the single memory cell increases, reliability deteriorates and read-failure rate increases. To store 'm' bits in a single memory cell, $2^m$ voltage level distributions are required. But since the voltage window for a memory cell is limited, the difference in threshold voltage between adjacent bits decreases as 'm' increases, causing the read-failure rate increases. For this reason, it is not easy to improve storage density using a MLC memory device.

Accordingly, it may be desirable to develop MLC memory devices, methods of storing data in the MLC memory devices, and/or methods of reading data from the MLC memory devices.

SUMMARY

Example embodiments may provide semiconductor memory devices that may have improved storage density. In addition, example embodiments may provide MLC memory devices that may have improved storage density.

Also, example embodiments may provide methods of storing data in memory devices that may have improved storage density. And example embodiments may provide methods of storing data in MLC memory devices that may have improved storage density.

Additionally, example embodiments may provide methods of reading data from memory devices that may have improved storage density. Further, example embodiments may provide methods of reading data from MLC memory devices that may have improved storage density.

According to example embodiments, a MLC memory device may include: 'a' number of m-bit MLC memory cells; an encoder that encodes 'k' bits of data at a code rate of k/n to generate an encoded bit stream; and a signal mapping module that applies pulses, according to the encoded bit stream, to the 'a' number of m-bit MLC memory cells in order to write the encoded bit stream in the 'a' number of m-bit MLC memory cells. In the MLC memory device, 'a' and 'm' may be integers greater than or equal to 2, 'k' and 'n' may be integers greater than or equal to 1, and/or 'n' may be greater than 'k'.

According to example embodiments, a method of storing data in a MLC memory device may include: encoding 'k' bits of data at a code rate of k/n to generate an encoded bit stream; and applying pulses, according to the encoded bit stream, to 'a' number of m-bit MLC memory cells in order to write the encoded bit stream in the 'a' number of m-bit MLC memory cells. In the method, 'a' and 'm' may be integers greater than or equal to 2, 'k' and 'n' may be integers greater than or equal to 1, and/or 'n' may be greater than 'k'.

According to example embodiments, a method of reading data from a MLC memory device may include: generating a demapped bit stream from pulses output from each of 'a' number of m-bit MLC memory cells in response to a read signal; and decoding 'n' bits of data from the demapped bit stream at a code rate of n/k to generate a decoded bit stream. In the method, 'a' and 'm' may be integers greater than or equal to 2, 'k' and 'n' may be integers greater than or equal to 1, and/or 'n' may be greater than 'k'.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
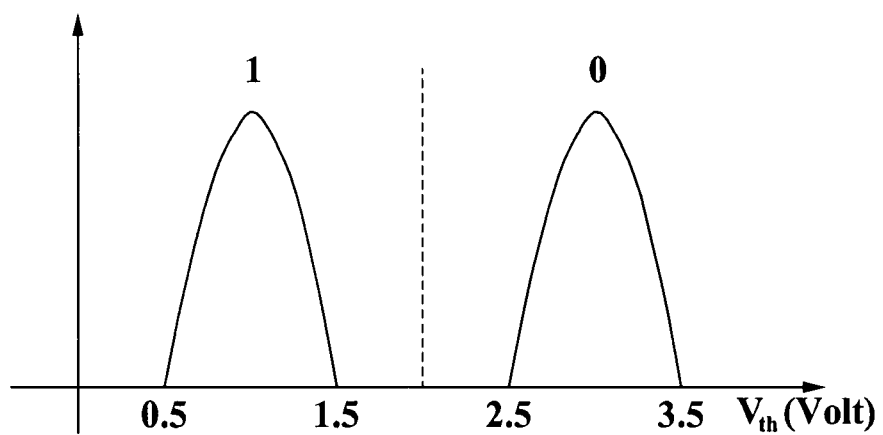
FIG. 1 illustrates a cell threshold voltage distribution of a SLC memory device according to related art.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," or "coupled to" to another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
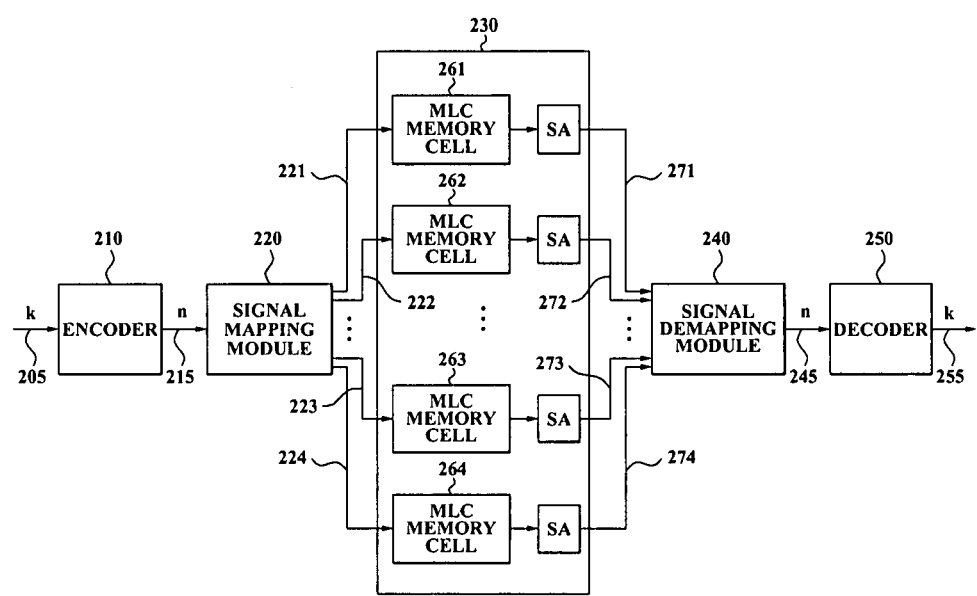
FIG. 2 is a block diagram illustrating a MLC memory device according to an example embodiment.

FIG. 2 is a block diagram illustrating a MLC memory device according to an example embodiment.

The MLC memory device according to example embodiments may include an encoder 210, a signal mapping module 220, a MLC memory cell array 230, a signal demapping module 240, and/or a decoder 250.

The MLC memory cell array 230 according to example embodiments may include 'a' number of m-bit MLC memory cells 261, 262, 263, and 264, wherein 'a' and 'm' are integers greater than or equal to 2. Since each of the m-bit MLC memory cells 261, 262, 263, and 264 may store m-bits of data, $2^m$ distributions may be required. As an example, $2^2$ (i.e., m=2, $2^2$=4) distributions for storing two bits of data are exemplarily shown in FIG. 5. However, the difference in threshold voltage between adjacent bits may decrease due to a limited voltage window. Accordingly, it may be more likely that an error occurs in the MLC memory cell during writing and/or reading operations. In example embodiments, such an error may be detected and/or corrected using encoding and/or decoding, thereby obtaining a MLC memory device of high storage density. A sense amplifier (SA) connected with each of the MLC memory cells 261, 262, 263, and 264 may receive a signal of data stored in the MLC memory cells 261, 262, 263, and 264 to sense and/or amplify the signal. The MLC memory cells 261, 262, 263, and 264 may be memory cells of a MLC flash memory.

The encoder 210 may encode k-bits of input data 205 at a code rate, for example, of k/n to generate an encoded bit stream 215 of 'n' bits, wherein 'k' and 'n' are integers greater than or equal to 1 and/or 'n' is greater than 'k'. The decoder 250 may detect an error or errors from a demapped bit stream 245 read from the MLC memory cell array 230 corresponding to the encoder 210 and/or may correct the detected error or errors, whereby accuracy of the data read from the MLC memory cell array 230 may be enhanced. In this case, the encoder 210 may add overhead of r-bits of data to the k-bits of input data 205 to generate an encoded bit stream 215 of k+r bits (where k+r=n). Accordingly, the code rate of the encoder 210 may become k/(k+r), i.e., k/n. The added r-bits of data may be used to detect and/or correct the error or errors generated when the k-bits of data are read after being stored in memory.

However, when the code rate is lower, a rate of data actually stored in the MLC memory cell array 230 may decrease. The effective bits per cell (effective bits/cell) is the number of bits of actual data, excluding data used for error detection and/or correction, among data stored in a single MLC memory cell. In the case of an m-bit MLC memory cell, m*R may be defined, wherein 'R' is a code rate. Accordingly, the effective bits per cell may become m*R=m*(k/n) and may increase as the code rate R increases. For example, when the code rate is higher, the rate of the data actually stored in the MLC memory cell array 230 may be higher. Accordingly, when the code rate is higher, the MLC memory cell array 230 may be more efficiently used.

Since 'k' and 'n' are integers greater than or equal to 1 and/or 'n' is greater than 'k', a maximum code rate available for the k-bit input data may be n=k+1. So, the maximum code rate may become k/(k+1). For example, the maximum code rate may be $\frac{1}{2}$ when the input data 205 is 1 bit, the maximum code rate may be $\frac{11}{12}$ when the input data 205 is 11 bits, and the maximum code rate may be $\frac{15}{16}$ when the input data 205 is 15 bits. When the input data 205 is 15 bits, an encoder having a code rate, for example, of $\frac{15}{20}$, $\frac{15}{32}$, or $\frac{15}{64}$ may be selected. In this case, the code rate of the selected encoder may be smaller than the maximum code rate (i.e., $\frac{15}{16}$). However, when the input data 205 is 15 bits, the code rate of $\frac{15}{16}$ may be selected.

It is noted that the maximum code rate may increase when 'n' increases. For example, the maximum code rate may become $\frac{1}{2}$, $\frac{2}{3}$, $\frac{3}{4}$, $\frac{4}{5}$, ..., $\frac{15}{16}$, ..., in accordance with a number of bits of the input data 205, and may increase when 'n' increases. As described above, the MLC memory cell array 230 may be more efficiently used as the code rate increases. Accordingly, an encoder in which 'n' is large may be selected as an encoder for enhancing the code rate.

Also, the m-bit MLC memory cell may store m-bits of data in one cell. When the code rate of k/n increases, 'n' may be greater than 'm'. Accordingly, a value of 'n' related to the code rate may be used that is less than 'm'. In example embodiments, a method for using a plurality of m-bit MLC memory cells may be provided to support a higher code rate.

To support the case where 'n' is greater than 'm', example embodiments may provide the 'a' number of m-bit MLC memory cells 261, 262, 263, and 264. Also, 'n' may equal the product of 'a' and 'm' (i.e., n=a*m). For example, in the case of 4-bit MLC memory cells, two 4-bit MLC memory cells may be used, and the encoder may be designed to have a code rate of ⅞. In this case, the input data 205 may be divided into seven bits and then encoded at the code rate of ⅞ by the encoder 210. The encoded bit stream 215 may become eight bits. The signal mapping module 220 may assign a signal to write the encoded bit stream 215 of eight bits in the two 4-bit MLC memory cells.

The encoded bit stream 215 generated by the encoder 210 may be stored in the MLC memory cell array 230 by the signal mapping module 220. Accordingly, the encoded bit stream 215 may be final digital data stored in the MLC memory cell array 230. The encoded bit stream 215 may include 'n' bits, and is called a systematic code when 'k' bits, which is a part of the 'n' bits, maintains a value of the bit stream of the input data 205 of the 'k' bits as is. When the encoded bit stream 215 of 'n' bits does not maintain the value of the bit stream of the input data 205 of 'k' bits as is, the encoded bit stream 215 is called a nonsystematic code. In example embodiments, the encoded bit stream 215 may be generated as a systematic code and/or a nonsystematic code. When the encoded bit stream 215 is generated as a systematic code, the example embodiments may have an advantage in that the data stored in the MLC memory cell array 230 may maintain the original value of the bit stream 205 of 'k' bits as is.

The signal mapping module 220 may apply a pulse according to the encoded bit stream 215 to the 'a' number of m-bit MLC memory cells 261, 262, 263, and 264 to assign a signal so that the data are written in the 'a' number of m-bit MLC memory cells 261, 262, 263, and 264. Specifically, the signal mapping module 220 may apply each of pulses 221, 222, 223, and 224 determined for each of the 'a' number of m-bit MLC memory cells 261, 262, 263, and 264 to each of the 'a' number of m-bit MLC memory cells 261, 262, 263, and 264. Each of the pulses may be one of $2^m$ levels which are modulated.

According to an example embodiment, the encoder 210 and the signal mapping module 220 may be combined with each other and thus may be realized in a coded modulation mode.

The signal demapping module 240 may generate a demapped bit stream 245 from pulses 271, 272, 273, and 274 output from each of the 'a' number of m-bit MLC memory cells 261, 262, 263, and 264 in response to an applied read signal.

The signal demapping module 240 may determine demapped partial bit streams from each of the pulses 271, 272, 273, and 274 output from each of the 'a' number of m-bit MLC memory cells 261, 262, 263, and 264 in response to the applied read signal. The signal demapping module 240 may compare a threshold voltage of $2^m$ distributions for each of the 'a' number of m-bit MLC memory cells 261, 262, 263, and 264 with each of the output pulses 271, 272, 273, and 274 to generate the demapped partial bit streams corresponding to each of the output pulses 271, 272, 273, and 274. Then, the signal demapping module 240 may combine the demapped partial bit streams with one another to generate the demapped bit stream 245.

Figure 3:
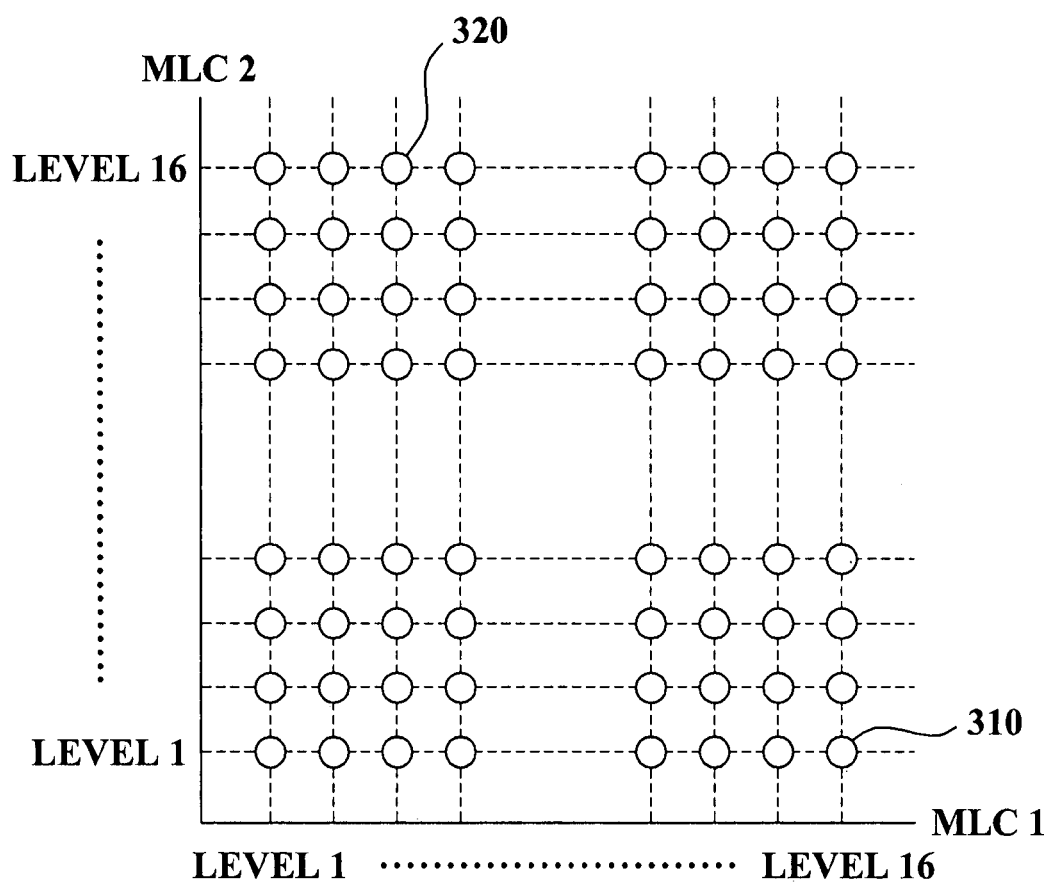
FIG. 3 illustrates a signal mapping for two MLC memory cell arrays of four bits according to an example embodiment.

The operation of the signal demapping module 240 according to one example embodiment will be described with reference to FIGS. 3 and 6. FIG. 3 illustrates a signal mapping for two MLC memory cell arrays of four bits according to an example embodiment.

When the data are stored in the two 4-bit MLC memory cells at a code rate of ⅞, the pulses may be output from each of the two 4-bit MLC memory cells when the read signal is applied to the MLC memory cells. It is assumed that the pulse output from the first MLC memory cell is −2.5 V and the pulse output from the second MLC memory cell is 2.5 V. In this case, the signal demapping module 240 may compare the pulse of −2.5 V output from the first MLC memory cell with a threshold voltage of $2^4$ (i.e., m=4, $2^4$=16) distributions and may determine the lowest four bits as "1111". Also, the signal demapping module 240 may compare the output pulse of 2.5 V output from the second MLC memory cell with the threshold voltage of $2^4$ distributions and may determine the highest four bits as "0000". This corresponds to a reference numeral 310 of FIG. 3. Then, the signal demapping module 240 may combine the demapped partial bit streams with one another to generate the demapped bit stream 245.

The decoder 250 may decode the demapped bit stream 245 of 'n' bits to generate decoded bit stream 255 of 'k' bits.

Error detection and/or error correction may depend on a decoding method. For example, error detection may be possible for four bits or less, while error correction may be possible for three bits or less. In this case, when an error is generated (or errors are generated) for 4 bits, the decoder 250 may be able to detect the error, but may not be able to correct the error or errors. Accordingly, the decoder 250 may notify an object (for example, an operating system, a memory management program, or the like), that may receive the decoded bit stream 255, that the error has been detected but has not been corrected (or that the errors have been detected but have not been corrected). Then, the object may perform additional operations based on the notification to efficiently use the memory.

Signal mapping for the two 4-bit MLC memory cells according to an example embodiment will be described with reference to FIG. 3. It is assumed that the code rate of the encoder 210 may be ⅞ in FIG. 3. In this case, the input data 205 may be divided into units of seven bits and then encoded at the code rate of ⅞ by the encoder 210, whereby the encoded bit stream 215 of eight bits may be obtained. Accordingly, the signal mapping module 220 may write the encoded bit stream 215 of eight bits in the 4-bit MLC memory cell. In example embodiments, two 4-bit MLC memory cells may be used. Each of the 4-bit MLC memory cells supports $2^4$ levels (i.e., 16 levels). The signal mapping module 220 may divide the encoded bit stream 215 of eight bits into four high bits and four low bits, may apply pulses determined by the four low bits to the first MLC memory cell, and may apply pulses determined by the four high bits to the second MLC memory cell. For example, when the encoded bit stream 215 is "00001111", the signal mapping module 220 may apply pulses of level 16 determined by the four low bits "1111" to the first MLC memory cell, and may apply pulses of level 1 determined by the four high bits "0000" to the second MLC memory cell. A point 310 may denote a level of pulses applied to the first and second MLC memory cells when the encoded bit stream 215 is "00001111". Similarly, when the encoded bit stream 215 is "11110010", the signal mapping module 220 may apply pulses of level 3 determined by the four low bits "0010" to the first MLC memory cell, and may apply pulses of level 16 determined by the four high bits "1111" to the second MLC memory cell. Another point 320 may denote a level of pulses applied to the first and second MLC memory cells when the encoded bit stream 215 is "11110010".

Figure 4:
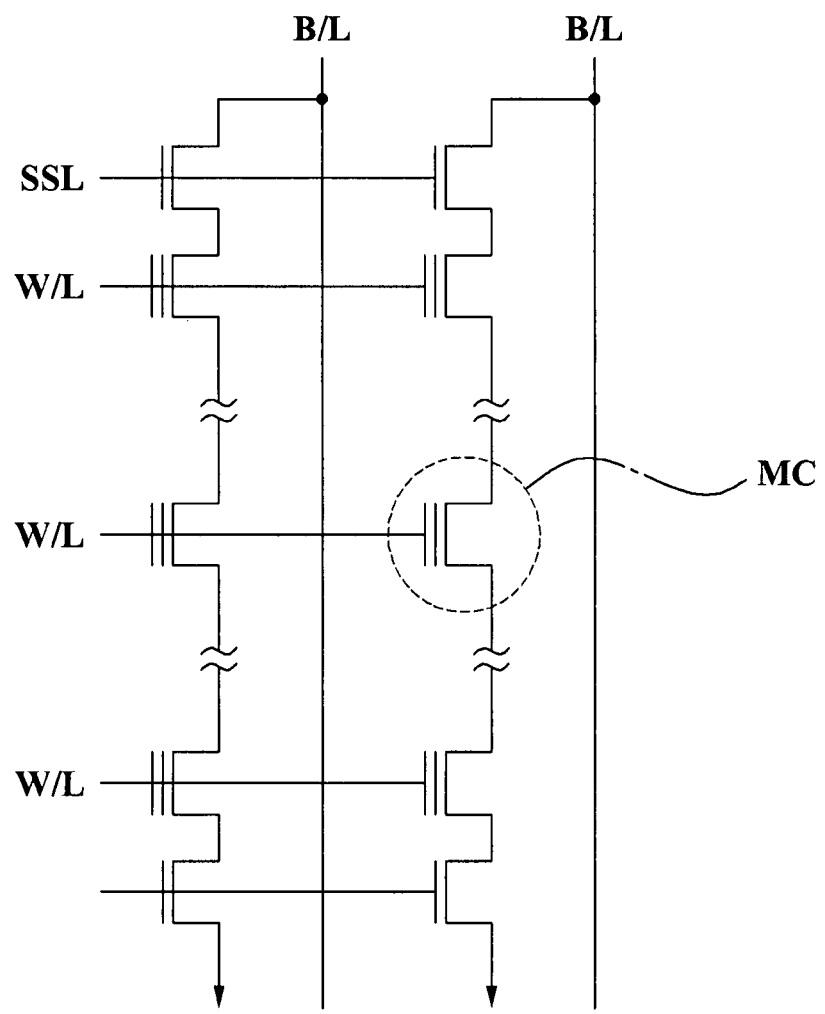
FIG. 4 illustrates a MLC memory cell array according to an example embodiment.

FIG. 4 illustrates a MLC memory cell array according to an example embodiment. Referring to FIG. 4, B/L denotes one or more bit lines, SSL denotes one or more string selection lines, W/L denotes one or more word lines, and MC denotes one or more memory cells. The memory cells of the MLC memory cell array, as shown in FIG. 4, may be MLC memory cells that can store data of two or more bits in a single memory cell.

Figure 5:
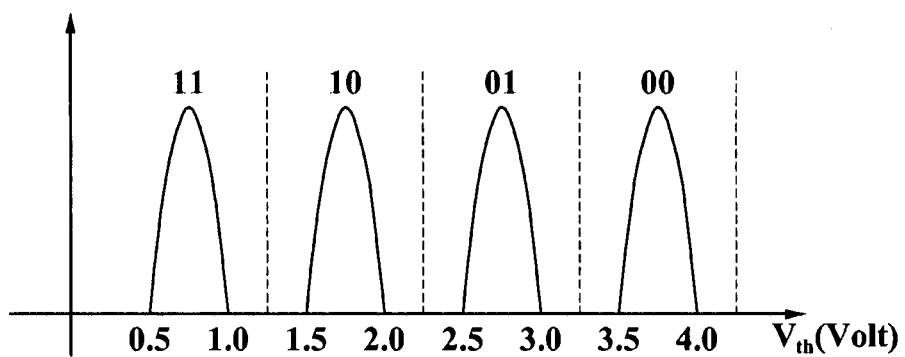
FIGS. 5 and 6 illustrate cell threshold voltage distributions and operation of a signal demapping module according to an example embodiment.
Figure 6:
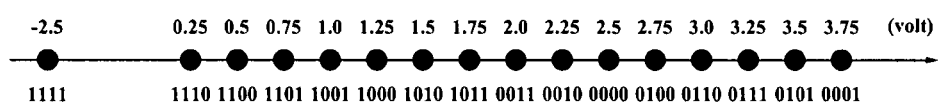

FIGS. 5 and 6 illustrate cell threshold voltage distributions and operation of a signal demapping module according to an example embodiment.

As shown in FIGS. 5 and 6, a voltage window for a single memory cell may be limited. In the case of FIGS. 5 and 6, the voltage window of the MLC memory cell may be greater than about −3.0 V and less than about 4.5 V (the lowest voltage shown is about −2.5 V and the highest voltage shown is about 4.0 V). Since two bits may be stored in a single MLC memory cell within the limited range of the voltage window, four distributions may be formed, as shown in FIG. 5. Also, since four bits may be stored in a single MLC memory cell within the limited range of the voltage window, 16 distributions may be formed, as shown in FIG. 6. In this way, to store 'm' bits in a single memory cell, $2^m$ distributions may be required. Since the voltage window may be limited, the difference in threshold voltage between adjacent bits may decrease when 'm' increases. Accordingly, it may be more likely that an error occurs during writing and/or reading operations in the MLC memory cell. In example embodiments, such an error or errors may be detected and/or corrected using an error correction code having a higher code rate. Thus, in example embodiments, a high density MLC memory device that stores four or more bits in a single memory cell may be obtained, and/or overhead accompanied with error detection and/or correction may be minimized by the higher code rate.

Referring to FIG. 5, the signal demapping module 240 may determine the demapped partial bit stream as a logic value "11" when a voltage greater than (or greater than or equal to) 0.5 V and less than (or less than or equal to) 1.0 V is obtained from the MLC memory cell 261, a logic value "10" when a voltage greater than (or greater than or equal to) 1.5 V and less than (or less than or equal to) 2.0 V is obtained from the MLC memory cell 261, a logic value "01" when a voltage greater than (or greater than or equal to) 2.5 V and less than (or less than or equal to) 3.0 V is obtained from the MLC memory cell 261, and/or a logic value "00" when a voltage greater than (or greater than or equal to) 3.5 V and less than (or less than or equal to) 4.0 V is obtained from the MLC memory cell 261. The data stored in the MLC memory cell 261 may be classified depending on the difference(s) between cell currents and/or cell voltages during the reading operations.

Likewise, the signal mapping module 220 may apply program pulses to the MLC memory cell 261 based on the encoded bit stream 215 so that a voltage level stored in the MLC memory cell 261 may be greater than (or greater than or equal to) 0.5 V and less than (or less than or equal to) 1.0 V when the logic value to be stored in the MLC memory cell 261 is "11".

The case where the logic value "01" may be written in the MLC memory cell 261 when the MLC memory cell 261 is a MLC flash memory cell will be described. Before writing in the MLC memory cell 261, the MLC memory cell 261 may be erased. The signal mapping module 220 may increase the voltage of the MLC memory cell 261 gradually in a positive direction while increasing a word line voltage gradually. Also, the signal mapping module 220 may verify whether the threshold voltage of the memory cell is greater than 2.5 V (or greater than or equal to 2.5 V) and less than 3.0 V (or less than or equal to 3.0 V). Accordingly, to write the logic value "01" in the MLC memory cell 261, the MLC memory cell 261 may be in the state of the logic value "01" after sequentially undergoing the logic value "11" and the logic value "10".

Figure 7:
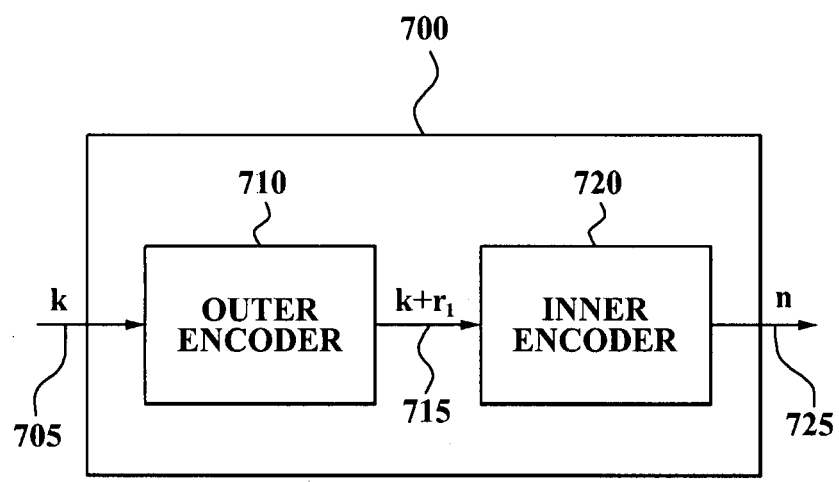
FIG. 7 is a block diagram illustrating an encoder according to an example embodiment.
Figure 8:
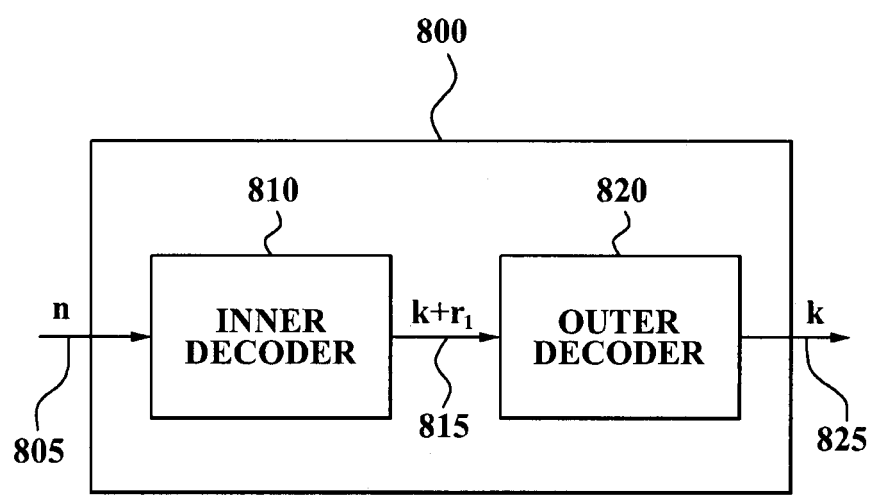
FIG. 8 is a block diagram illustrating a decoder according to an example embodiment.

FIG. 7 is a block diagram illustrating the encoder 700 according to an example embodiment. FIG. 8 is a block diagram illustrating the decoder 800 according to an example embodiment. The encoder 700 and/or the decoder 800 may use concatenated coding.

The encoder 700 shown in FIG. 7 may use concatenated coding when encoding data of 'k' bits to generate an encoded bit stream of 'n' bits, wherein the concatenated coding may represent that two steps of outer coding and inner coding are concatenated. Block coding may be used for outer coding and/or convolutional coding may be used for inner coding. The block coding may be used to encode and/or decode data for the unit of a certain block. The convolutional coding may be used to encode previous data and/or current data. Since the convolutional coding may use previous data for encoding, a memory device for previous data may be required. The block coding may be advantageous for detection and/or correction of burst error, while the convolutional coding may be advantageous for detection and/or correction of random error. Accordingly, when data is written in the MLC memory device according to example embodiments, the block coding may be used for outer coding, while the convolutional coding may be used for inner coding. In this way, error correction performance advantageous for both burst error and random error may be obtained.

An outer encoder 710 may receive source data 705 of 'k' bits to be stored in the MLC memory device in order to generate an outer encoded bit stream 715 at a code rate of $k/(k+r_1)$. At this time, linear block encoding may be used.

Examples of linear block encoding include Hamming coding; Bose, Ray-Chaudhuri, Hocquenghem (BCH) coding; Reed-Solomon (RS) coding; and Golay coding. The linear block encoding may block the source data into k-bit units. For example, the source data may be divided into k-bit units. The outer encoder 710 may add overhead of $r_1$ bits to the blocked bit stream 705 of 'k' bits in order to generate the outer encoded bit stream 715 of $k+r_1$ bits. Accordingly, the outer encoder 710 may have a code rate of $k/(k+r_1)$. The added $r_1$ bit may be a parity bit (or the added $r_1$ bits may be parity bits) and may be added to the bit stream 705 of 'k' bits. In this case, an inner decoder 810 of FIG. 8 may perform error detection and/or error correction of 'k' bits of data, referring to the $r_1$ bit or bits when reading the data from the MLC memory device.

An inner encoder 720 may encode the outer encoded bit stream 715 at a code rate of $(k+r_1)/n$ in order to generate an inner encoded bit stream 725. At this time, convolutional code encoding may be used.

The convolutional code encoding may detect and/or correct errors using convolutional relationships between current data and previous data. The convolutional code encoding may be advantageous for detection and/or correction of random error. The inner encoder 720 may encode the outer encoded bit stream 715 of $k+r_1$ bits to generate the inner encoded bit stream 725 of $k+r_1+r_2$ bits. Accordingly, overhead added by the inner encoder 720 may be an $r_2$ bit or bits, and the code rate of the inner encoder 720 may be $(k+r_1)/(k+r_1+r_2)$. Supposing that $k+r_1+r_2$ is equal to 'n', the code rate through the outer encoder 710 and the inner encoder 720 may be k/n. In this case, since n−k is the number of bits added for detection and/or correction of errors generated when 'k' bits of data are stored in the MLC memory cell, n−k may be minimized. Accordingly, when 'n' is equal to k+1, the added bit may be 1 bit and the maximum code rate of k/(k+1) may be obtained. In example embodiments, 'a' number of m-bit memory cells are used, and 'n' may be set by the product of 'a' and 'm' (i.e., n=a*m) to enable encoding at a higher code rate. In this way, the bits added, for detection and/or correction of errors generated when 'k' bits of data are stored in the MLC memory cell, may be minimized.

Decoder 800 may include inner decoder 810 and/or outer decoder 820. The inner decoder 810 may decode a demapped bit stream 805 using a second decoding method in order to generate an inner decoded bit stream 815. Viterbi decoding, for example, may be used as the second decoding method. The inner decoder 810 may decode the demapped bit stream 805 of $k+r_1+r_2$ (=n) bits in order to generate the inner decoded bit stream 815 of $k+r_1$ bits. The inner decoder 810 may detect errors included in a demapped bit stream 805 using the second decoding method and/or may correct the detected errors. When Viterbi decoding is used as the second decoding method, it may be advantageous for detection and/or correction of random errors.

The outer decoder 820 may decode an inner decoded bit stream 815 of $k+r_1$ bits using a first decoding method to generate an outer decoded bit stream 825 of 'k' bits. The outer decoder 820 may detect an error or errors included in the inner decoded bit stream 815 using the first decoding method and/ or may correct the detected error or errors. A decoding method corresponding to the first encoding method may be used as the first decoding method. When linear block encoding—such as Hamming coding, BCH coding, RS coding, and/or Golay coding—is used as the first encoding method, linear block decoding corresponding to the linear block encoding may be used as the first decoding method. For example, when encoding according to RS coding is used as the first encoding method, decoding according to RS coding may be used as the first decoding method.

As described above, error detection and/or correction of two steps may be performed in such a manner that the inner decoder 810 may correct the errors detected from the demapped bit stream 805 in order to generate the inner decoded bit stream 815, and/or the outer decoder 820 may correct the errors detected from the inner decoded bit stream 815 in order to generate the outer decoded bit stream 825. Thus, according to example embodiments, it may be possible to more accurately read a signal during reading operation of the MLC memory device. In this way, the MLC memory device of high density may be obtained.

The above-described example embodiments may be recorded in computer-readable media, including program instructions to implement various operations embodied by a computer. The media also may include, alone or in combination with the program instructions, data files, data structures, and the like. The media and/or program instructions may be those specially designed and/or constructed for the purposes of example embodiments, or they may be of the kind well-known and available to those having ordinary skill in the computer software arts. Examples of computer-readable media include magnetic media such as hard disks, floppy disks, and magnetic tape; optical media such as CD (compact disc) ROM (read-only memory) disks and DVD (digital video disc); magneto-optical media such as optical disks; and/or hardware devices that may be specially configured to store and/or perform program instructions, such as ROM, random access memory (RAM), flash memory, and the like. The media also may be a transmission medium such as optical or metallic lines, wave guides, and the like, including a carrier wave transmitting signals specifying the program instructions, data structures, and the like. Examples of program instructions include both machine code, such as produced by a compiler, and files containing higher level code that may be executed by the computer using an interpreter. The described hardware devices may be configured to act as one or more software modules in order to perform the operations of the above-described example embodiments.

For example, portions of the encoder 210, the signal mapping module 220, the signal demapping module 240, the decoder 250, the encoder 700, the outer encoder 710, the inner encoder 720, the decoder 800, the inner decoder 810, and/or the outer decoder 820, that are described in example embodiments, may be provided by computer program(s). In this case, example embodiments may include such computer program(s).

As described above, according to example embodiments, a new error correction may be applied to the MLC memory device to stably increase bits stored in a single memory cell. Unlike the related art, a MLC memory device of high storage density, that may use efficient error correction to store data of four or more bits in a single memory cell, may be provided in accordance with example embodiments.

Although the MLC memory device according to example embodiments may have overhead required for additional circuits, data capacity of the memory may increase more than the overhead.

Also, according to example embodiments, since the data may be written in the MLC memory through encoding of the higher code rate, the number of bits stored in a single MLC memory may increase and, at the same time, the overhead of encoding and/or decoding due to the increase in the number of bits may be minimized.

Also, according to example embodiments, the code rate of the m-bit MLC memory may be k/n, and encoding and/or decoding may be used for the MLC memory when 'n' is greater than 'm'.

When the number of bits stored in a single MLC memory increases, the difference in threshold voltage between adjacent bits may decrease. For this reason, a read-failure rate may increase. However, this problem may be reduced and/or eliminated in example embodiments.

Also, according to example embodiments, since errors included in the signal read from the MLC memory device may be corrected, reliability and productivity of a flash memory may be improved.

Finally, according to example embodiments, error correction methods advantageous for both random error and burst error may be provided for the MLC memory device.

While example embodiments have been particularly shown and described, it will be understood by those of ordinary skill in the art that various changes in form and details may be made therein without departing from the spirit and scope of the present invention as defined by the following claims.

What is claimed is:

1. A multi-level cell (MLC) memory device, comprising:
'a' number of m-bit MLC memory cells;
an encoder that encodes 'k' bits of data at a code rate of k/n to generate an encoded bit stream; and
a signal mapping module that applies pulses, according to the encoded bit stream, to the 'a' number of m-bit MLC memory cells in order to write the encoded bit stream in the 'a' number of m-bit MLC memory cells;

wherein 'a' and 'm' are integers greater than or equal to 2,
wherein 'k' and 'n' are integers greater than or equal to 1,
wherein 'n' is greater than 'k', and
wherein n=a*m=k+1.

2. The device of claim 1, wherein the encoder and the signal mapping module are combined with each other.

3. The device of claim 1, wherein each of the 'a' number of m-bit MLC memory cells are memory cells of a MLC flash memory.

4. The device of claim 1, wherein the signal mapping module applies each of the pulses, that are determined for each of the 'a' number of m-bit MLC memory cells according to the encoded bit stream, to each of the 'a' number of m-bit MLC memory cells.

5. The device of claim 4, wherein each of the pulses is one of $2^m$ levels that can be generated by $2^m$ pulse amplitude modulation.

6. The device of claim 1, further comprising:
a signal demapping module;
wherein the signal demapping module generates a demapped bit stream from pulses output from each of the 'a' number of m-bit MLC memory cells in response to a read signal.

7. The device of claim 6, further comprising:
a decoder;
wherein the decoder decodes the demapped bit stream to generate a decoded bit stream of 'k' bits.

8. The device of claim 6, wherein the signal demapping module determines partial bit streams demapped from each of the pulses output from each of the 'a' number of m-bit MLC memory cells in response to the read signal, and wherein the signal demapping module combines the demapped partial bit streams to generate the demapped bit stream.

9. The device of claim 8, wherein the signal demapping module compares threshold voltages of $2^m$ distributions of each of the 'a' number of m-bit MLC memory cells with each of the output pulses to generate the demapped partial bit streams corresponding to each of the output pulses.

10. A method of storing data in a multi-level cell (MLC) memory device, the method comprising:
encoding 'k' bits of data at a code rate of k/n to generate an encoded bit stream; and
applying pulses, according to the encoded bit stream, to 'a' number of m-bit MLC memory cells in order to write the encoded bit stream in the 'a' number of m-bit MLC memory cells;
wherein 'a' and 'm' are integers greater than or equal to 2,
wherein 'k' and 'n' are integers greater than or equal to 1,
wherein 'n' is greater than 'k', and
wherein n=a*m=k+1.

11. A method of reading data from a multi-level cell (MLC) memory device, the method comprising:
generating a demapped bit stream from pulses output from each of 'a' number of m-bit MLC memory cells in response to a read signal; and
decoding 'n' bits of data from the demapped bit stream at a code rate of n/k to generate a decoded bit stream;
wherein 'a' and 'm' are integers greater than or equal to 2,
wherein 'k' and 'n' are integers greater than or equal to 1,
wherein 'n' is greater than 'k', and
wherein n=a*m=k+1.

\* \* \* \* \*